US010269814B2

(12) United States Patent
Liao et al.

(10) Patent No.: US 10,269,814 B2
(45) Date of Patent: Apr. 23, 2019

(54) METHOD OF FABRICATING SEMICONDUCTOR STRUCTURE

(71) Applicant: TAIWAN SEMICONDUCTOR MANUFACTURING CO., LTD., Hsinchu (TW)

(72) Inventors: Keng-Ying Liao, Tainan (TW); Po-Zen Chen, Tainan (TW); Yi-Jie Chen, Tainan (TW); Yi-Hung Chen, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/134,262

(22) Filed: Apr. 20, 2016

(65) Prior Publication Data

US 2017/0154891 A1  Jun. 1, 2017

Related U.S. Application Data

(60) Provisional application No. 62/261,206, filed on Nov. 30, 2015.

(51) Int. Cl.
*H01L 21/28* (2006.01)
*H01L 29/66* (2006.01)
(Continued)

(52) U.S. Cl.
CPC .. *H01L 27/11521* (2013.01); *H01L 21/28273* (2013.01); *H01L 21/31116* (2013.01);
(Continued)

(58) Field of Classification Search
CPC ..... H01L 21/823468; H01L 21/823864; H01L 21/28273; H01L 21/31116;
(Continued)

(56) References Cited

U.S. PATENT DOCUMENTS 5,723,893 A    3/1998  Yu et al.
6,114,767 A *  9/2000  Nagai .................. H01L 27/115
                                                    257/315

(Continued)

FOREIGN PATENT DOCUMENTS

KR    10-2008-0054698 A    6/2008
KR    10-2010-0037769 A    4/2010
(Continued)

OTHER PUBLICATIONS

Corresponding Korean Patent Application Office Action dated Sep. 5, 2017 (7 pgs).

(Continued)

*Primary Examiner* — Dale E Page
*Assistant Examiner* — Quovaunda Jefferson
(74) *Attorney, Agent, or Firm* — Cooper Legal Group, LLC

(57) ABSTRACT

The present disclosure provides a method of fabricating a semiconductor structure, and the method includes following steps. A gate structure is formed on a substrate, and a liner layer is formed to cover the gate structure and the substrate. A spacer layer is formed on the liner layer, and an etching gas is continuously provided to remove a portion of the spacer layer while maintaining the substrate at a second pressure, which the etching gas has a first pressure. The second pressure is greater than the first pressure.

11 Claims, 9 Drawing Sheets

(51) Int. Cl.
*H01L 21/311* (2006.01)
*H01L 27/11521* (2017.01)

(52) U.S. Cl.
CPC ...... *H01L 29/6653* (2013.01); *H01L 29/6656* (2013.01); *H01L 29/66825* (2013.01)

(58) Field of Classification Search
CPC ........... H01L 21/76834; H01L 29/6653; H01L 29/6656; H01L 29/66825
See application file for complete search history.

(56) References Cited

U.S. PATENT DOCUMENTS

| | | | |
|---|---|---|---|
| 6,225,203 B1 | 5/2001 | Liu et al. | |
| 6,251,764 B1 | 6/2001 | Pradeep et al. | |
| 6,312,568 B2* | 11/2001 | Wilke | C23C 14/0042 204/192.15 |
| 6,355,183 B1* | 3/2002 | Ohkuni | H01J 37/321 216/67 |
| 2005/0153553 A1* | 7/2005 | Lee | H01L 21/67063 438/689 |
| 2006/0094216 A1* | 5/2006 | Nam | H01L 21/31116 438/595 |
| 2008/0081483 A1 | 4/2008 | Wu | |
| 2008/0308899 A1 | 12/2008 | Huang et al. | |
| 2014/0291735 A1 | 10/2014 | Shen et al. | |

FOREIGN PATENT DOCUMENTS

| | | |
|---|---|---|
| TW | 200840050 A | 10/2008 |
| TW | 201405668 A1 | 2/2014 |

OTHER PUBLICATIONS

Corresponding Taiwanese Patent Application 1st Office Action dated Apr. 6, 2017 (6 pgs).

* cited by examiner

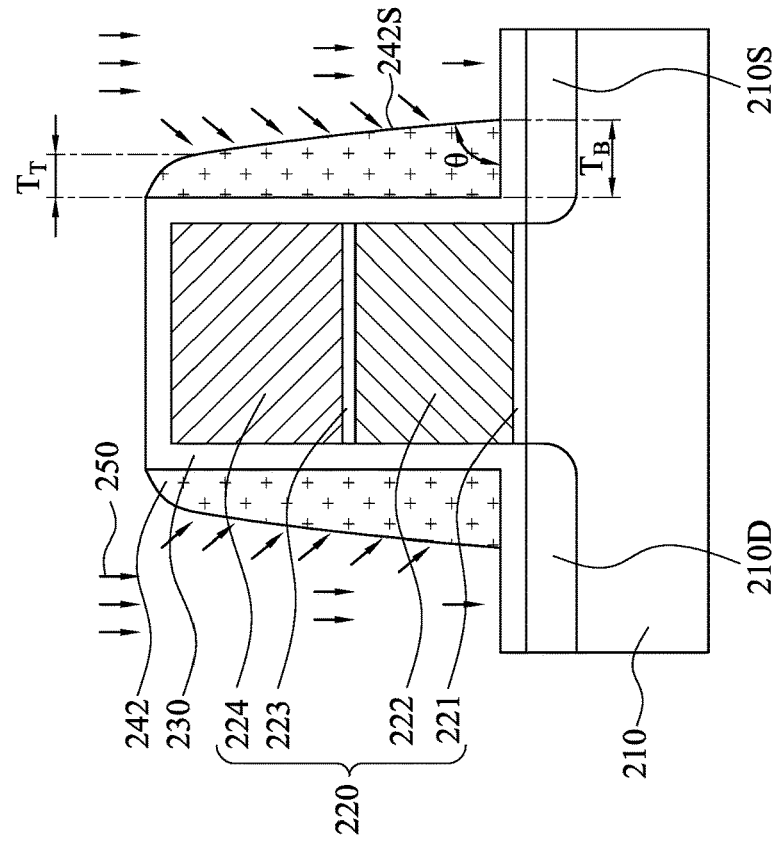
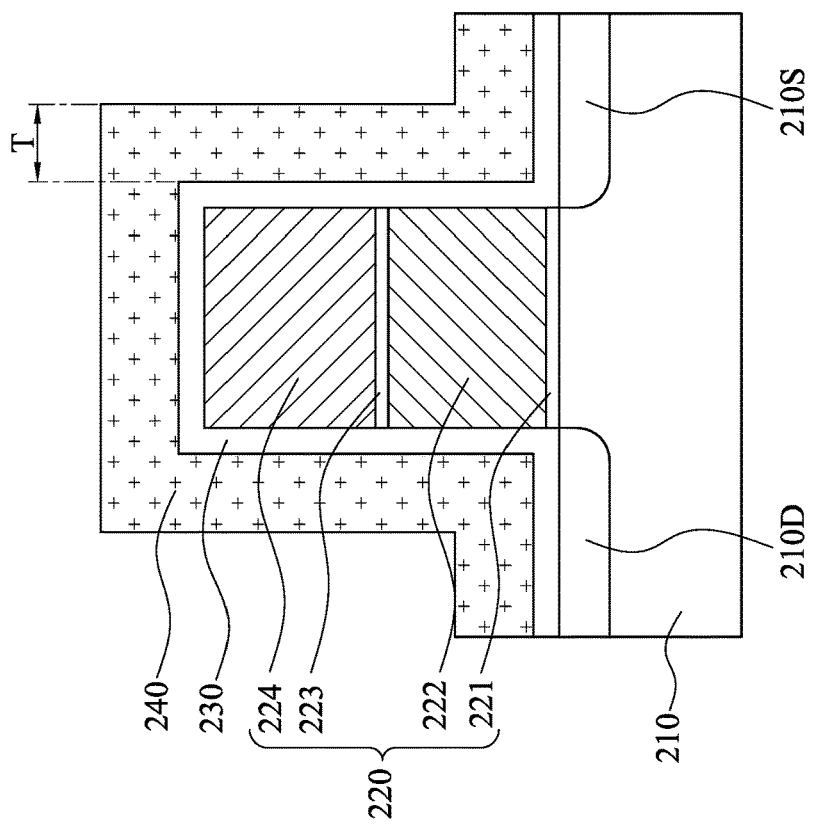
Fig. 2D
Fig. 2C

METHOD OF FABRICATING SEMICONDUCTOR STRUCTURE

RELATED APPLICATIONS

This application claims priority to US provisional Application Ser. No. 62/261,206, filed Nov. 30, 2015, which is herein incorporated by reference.

BACKGROUND

The semiconductor integrated circuit (IC) industry has experienced rapid growth. Over the course of the growth, functional density of the semiconductor devices has increased with decrease of device feature size or geometry. The scaling down process generally provides benefits by increasing production efficiency, reducing costs, and/or improving device performance. However, such scaling down has also increased complexity of the IC manufacturing processes.

In deep sub-micron integrated circuit technology, non-volatile memory device has become a popular storage unit due to various advantages. Particularly, the data saved in the non-volatile memory device are not lost when the power is turned off. One particular example of the non-volatile memory device includes a floating gate to retain the electrical charges associated with the saved data. However, as technologies evolve, nodes of semiconductor process have been scaled down for high density non-volatile memory device. In the manufacturing process of non-volatile memory device, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2E are cross-sectional views of the semiconductor structure at an intermediate stage of fabrication, in accordance with various embodiments.

DETAILED DESCRIPTION

Figure 1:
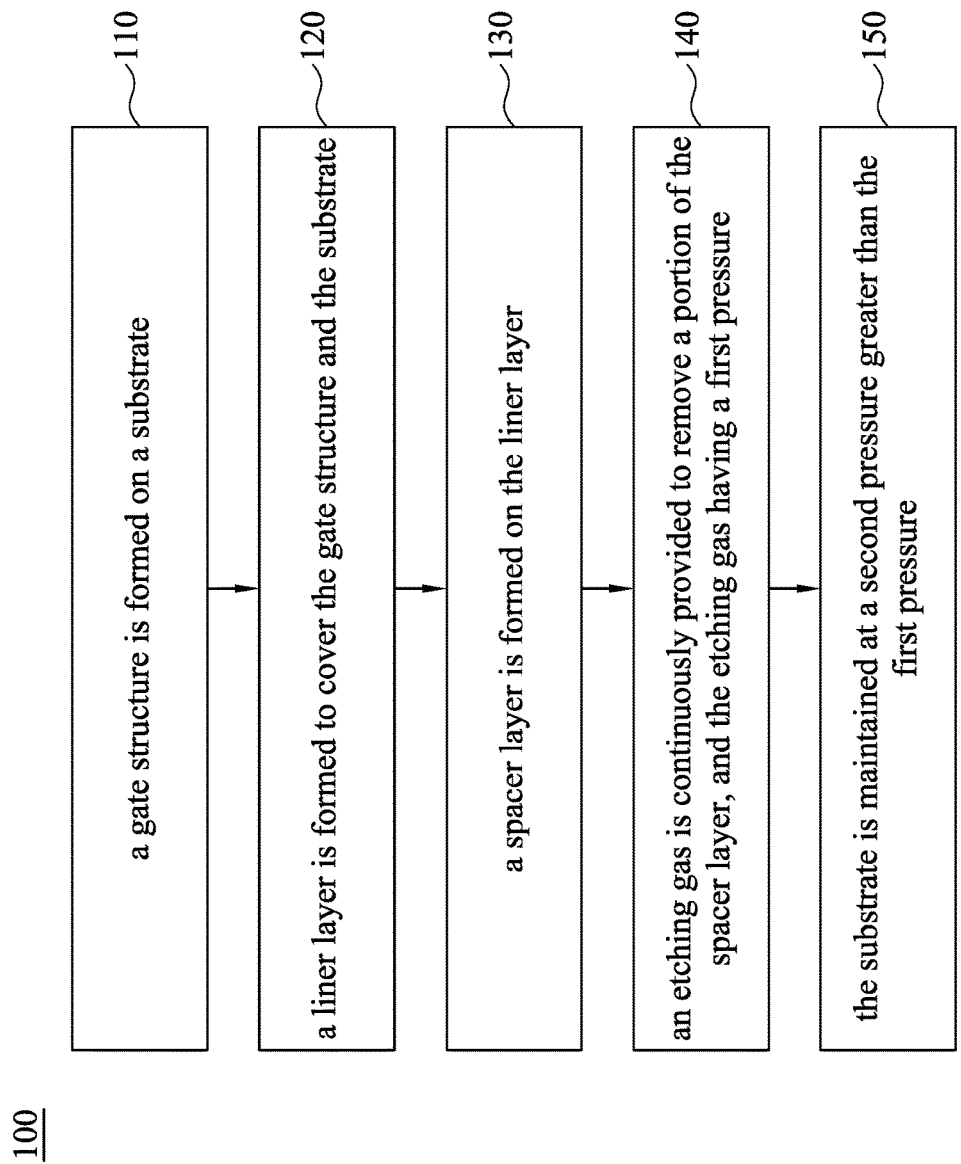
FIG. 1 illustrates a flow chart of a method of fabricating a semiconductor structure, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, gate structures are formed on a substrate, and vertical spacers are respectively formed on sidewalls of the gate structures. A gap between the adjacent two vertical spacers is filled with a dielectric material to isolate these gate structures. However, as an integrated circuit has been largely driven by the need to the decreased feature sizes, a distance between these gate structures is also decreased. In addition, a height of the gate structure is also increased corresponding to the necessary of the integrated circuit. Therefore, an aspect ratio of the gap is enormously increased, which is uneasy to be fully filled, and a void is inevitably remained and cause leakage in the semiconductor structure. As such, an improved semiconductor structure and a fabrication method thereof is necessary to solve above problems.

FIG. 1 illustrates a flow chart 100 of a method of fabricating a semiconductor structure, in accordance with various embodiments. The flow chart 100 includes following steps. In step 110, a gate structure is formed on a substrate. In step 120, a liner layer is formed to cover the gate structure and the substrate. In step 130, a spacer layer is formed on the liner layer. In step 140, an etching gas is continuously provided to remove a portion of the spacer layer, and the etching gas having a first pressure. In step 150, the substrate is maintained at a second pressure larger than the first pressure.

Figure 2B:
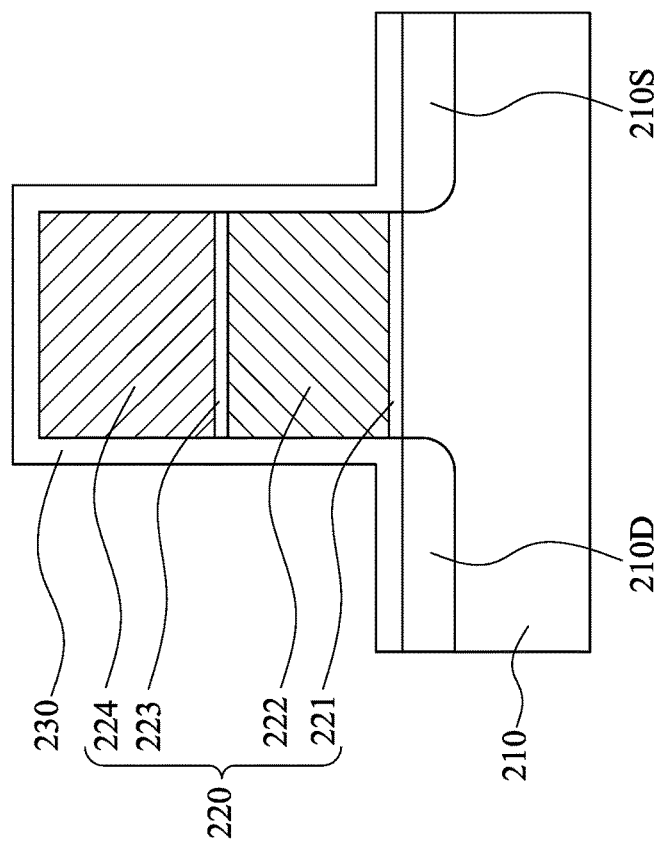
Figure 2A:
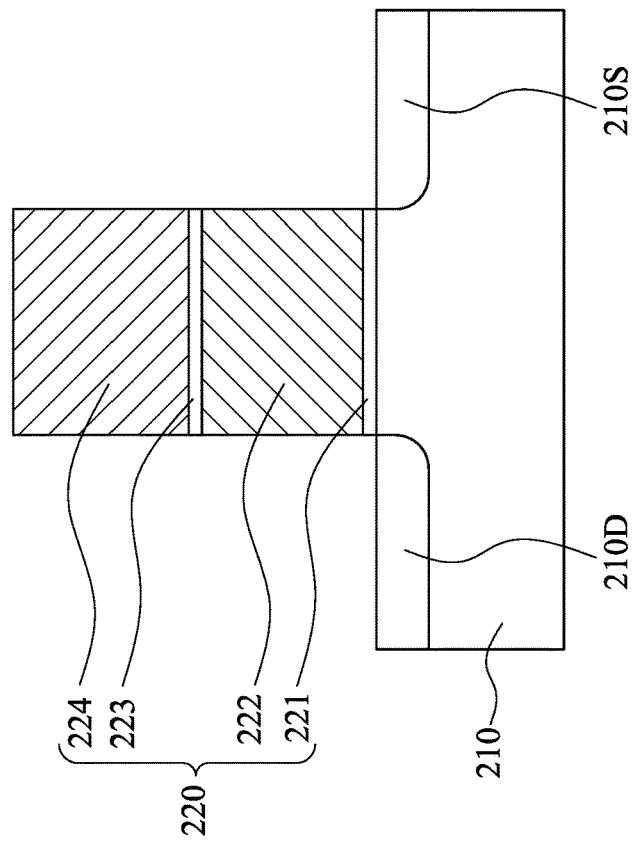

Referring to FIGS. 2A to 2E at the same time. FIGS. 2A to 2E are cross-sectional views of the semiconductor structure at an intermediate stage of fabrication, in accordance with various embodiments. FIG. 2A illustrates operation 110, which a gate structure 220 is formed on a substrate 210. The gate structure 220 may be formed using suitable processes including photolithography and etching processes. First, a gate material is formed to cover the substrate, and a photoresist layer (not shown) is formed to overly the gate material. Then, the photoresist layer is exposed to form a pattern, and a post-exposure bake process and a developing process are performed to form a masking element. The masking element mentioned above is used to protect portions of the gate material while performing the etching process, leaving the gate structure 220 on the substrate 210.

In some embodiments, the substrate 210 is a bulk silicon substrate. In some embodiments, the substrate 210 includes an elementary semiconductor including silicon or germanium in crystal, polycrystalline, and/or an amorphous structure. In some other embodiments, the substrate 210 includes a compound semiconductor including silicon carbide, gallium arsenic, gallium phosphide, indium phosphide, indium arsenide, and/or indium antimonide. In some alternative embodiments, the substrate 210 includes an alloy semiconductor including SiGe, GaAsP, AlInAs, AlGaAs, GaInAs, GaInP, and/or GaInAsP; any other suitable material; and/or combinations thereof.

After forming the gate structure 220, an ion implantation process is performed to form doped regions in the substrate 210. The doped regions include a source 210S and a drain 210D respectively on opposite sides of the gate structure 220 and aligned with respect to a sidewall of the gate structure 220. In some embodiments, the ion implantation process is a vertical ion implantation process using an N-type dopant or a P-type dopant, at a dopant dose in a range from about $5 \times 10^{12}$ ions/cm$^2$ to about $1 \times 10^{14}$ ions/cm$^2$ and at an energy level in a range from about 0.5 keV to about 10 keV.

In some embodiments, the gate structure 220 is a memory gate structure including a gate insulation layer 221, a floating gate 222, an inter-gate dielectric layer 223 and a control gate 224. The gate insulation layer 221 is on the substrate 210, and the floating gate 222 is on the gate insulation layer 221. The inter-gate dielectric layer 223 is on the floating gate 222, and the control gate 224 is on the inter-gate dielectric layer 223. Specifically, a variable amount of charge, such as electrons, is stored in the floating gate 222. The charge is advantageously stored in a non-volatile manner so that the stored charge persists in the absence of power. The amount of charge stored in the floating gate 222 represents a value, such as binary value, and is varied through program (i.e., write), read, and erase operations. These operations are performed through selective biasing of the control gate 224. For example, the control gate 224 is biased with a high voltage, which promotes Fowler-Nordheim tunneling of carriers from a channel region between the source 210S and the drain 210D toward the control gate 224. As the carriers tunnel towards the control gate 224, the carriers become trapped in the floating gate 222 to represent a value (such as, 1 or 0).

In some embodiments, the gate insulation layer 221 is a high-k layer including an oxide such as hafnium oxide ($HfO_2$), zirconium dioxide ($ZrO_2$), tantalum silicon oxide ($TaSiO_x$), a thermal oxide, a nitride, or the like, or a combination thereof. In some embodiments, the floating gate 222 and the control gate 224 are formed of polysilicon, but not limited thereto, and the inter-gate dielectric layer 223 is, for example, ONO (oxide-nitride-oxide) dielectric.

Continuing in FIG. 2B and operation 120, a liner layer 230 is formed to cover the gate structure 220 and the substrate 210. The liner layer 230 may be formed by conformably depositing a layer of an appropriate material, so as to cove a top surface of the substrate 210 and sidewalls and a top surface of the gate structure 220. In some embodiments, the liner layer 230 is formed of an insulating material, such as silicon oxide, silicon nitride, silicon oxynitride, ONO dielectric, or a combination thereof. In some embodiments, the liner layer 230 is formed by using chemical vapor deposition (CVD), physical vapor deposition (PVD), atomic layer deposition (ALD) or other suitable depositing processes.

Continuing in FIG. 2C and operation 130, a spacer layer 240 is formed to cover the liner layer 230. The spacer layer 240 is formed by conformably depositing an appropriate material to cove the liner layer 230, and a thickness T1 of the spacer layer 240 is greater than that of the liner layer 230. In some embodiments, the spacer layer 240 is formed of an insulating material, such as silicon oxide, silicon nitride, silicon oxynitride, or a combination thereof. In some embodiments, the spacer layer 240 is formed by using chemical vapor deposition (CVD), physical vapor deposition (PVD), atomic layer deposition (ALD) or other suitable depositing processes.

Figure 3:
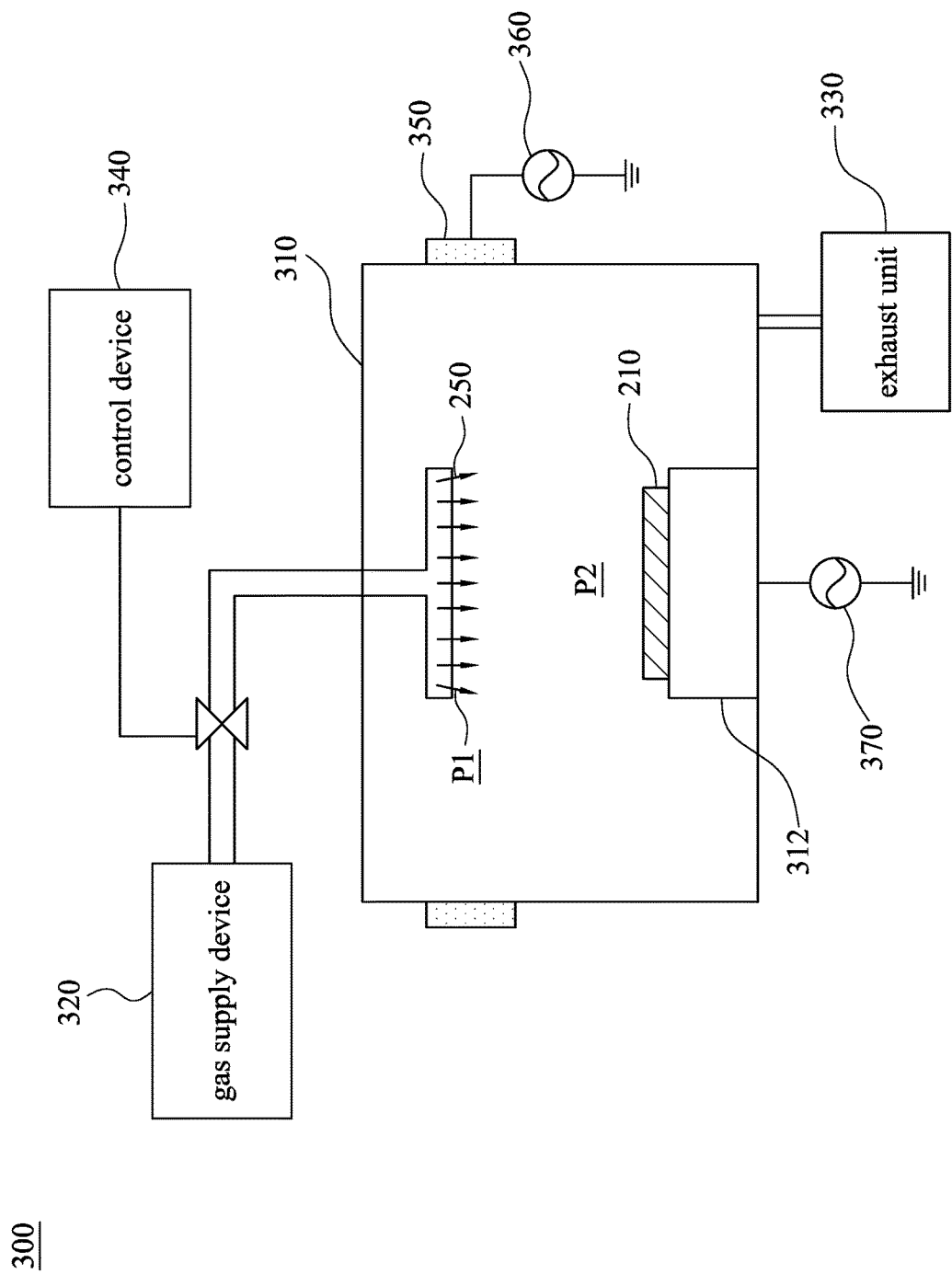
FIG. 3 illustrates a cross-sectional view of a dry etching apparatus in accordance with various embodiments.

Continuing in FIG. 2D, which illustrates operation 140 and 150. In FIG. 2D, an etching gas 250 having a first pressure P1 is continuously provided to remove a portion of the spacer layer 240 while maintaining the substrate at a second pressure P2, which the second pressure P2 is greater than the first pressure P1. Refer to FIG. 3 at the same time, which illustrates a cross-sectional view of a dry etching apparatus 300 in various embodiment of the present disclosure. The dry etching apparatus 300 includes a vacuum chamber 310 configured to secure the substrate 210. In some embodiments, a stage 312 in the vacuum chamber 310 is configured to secure the substrate 210. A gas supply device 320 is above the vacuum chamber 310 and configured to supply the etching gas 250 into the vacuum chamber 310, and an exhaust unit 330 is below the vacuum chamber 310 and configured to expel the etching gas 250 and byproducts of the etching gas 250 from the vacuum chamber 310, so as to control a pressure of the vacuum chamber 310.

First, the substrate 210 having the gate structure 220, the liner layer 230 and the spacer layer 240 thereon is placed in the vacuum chamber 310, and a dry etching process is performed by continuously providing the etching gas 250 into the vacuum chamber 310 to remove the portion of the spacer layer 240. In addition, a control device 340 of the dry etching apparatus 300 is configured to control the etching gas 250 entering the vacuum chamber 310 at the first pressure P1. Simultaneously, the exhaust unit 330 is actuated to maintain the vacuum chamber 310 at the second pressure P2 greater than the first pressure P1 of the etching gas 250. Specifically, an exhausting rate of the etching gas 250 and the byproducts is less than a providing rate of the etching gas 250, so the etching gas 250 is accumulated in the vacuum chamber 310 to form the second pressure P2 greater than the first pressure P1. Described in different ways, the exhaust unit 330 is below the vacuum chamber 310 to generate a force pulling downward the etching gas 250 in the vacuum chamber 310, and the force is decreased in respect to the decrease of the exhausting rate. With the decreasing force, the etching gas 250 flows downward slowly and remains in the vacuum chamber 310. In some embodiments, the exhausting unit 330 is a turbo pump.

The dry etching apparatus 300 further includes an antenna 350 at sidewalls of the vacuum chamber 310, and a plasma generating device 360 is connected to the antenna 350 for generating a plasma from the etching gas 250, which the plasma generating device 360 is a high-frequency power source. The frequency of the high-frequency power source for plasma generation is from 13.56 MHz to 60 MHz. Furthermore, the plasma generating device 360 for plasma generation may also be driven in a pulsed method. In addition, the dry etching apparatus 300 further includes a radio frequency (RF) bias power supply 370 of 4 MHz connected to the stage 312, which is on the purpose to draw ions into the substrate 210 from the plasma to control the ion energy.

In some embodiments, the first pressure P1 is in a range from 100 mtorr to 150 mtorr, and the second pressure P2 is in a range from 200 mtorr to 300 mtorr. In some embodiments, the etching gas 250 is selected from a group consisting of $C_4F_2$, $C_4F_8$, $C_5F_6$, $C_5F_8$, $CF_4$, $CF_3$, $CHF_3$, $CH_2F_2$, $SF_6$, $NF_3$, $F_2$ and a combination thereof.

Referring back to FIG. 2D, the plasma generated from the etching gas 250 will etch the spacer layer 240. As aforementioned, the substrate 210 in the vacuum chamber 310 is maintained at the second pressure P2 greater than the first pressure P1 of the etching gas 250, so as to decrease the force pulling downward the etching gas 250. As such, the etching gas 250 flows downward slowly and almost aggregates at a top of the spacer layer 240, and an amount of the etching gas 250 is gradually decreased from the top to a bottom of the spacer layer 240. Large amount of the etching gas 250 would cause lateral etch of the spacer layer 240, since the etching gas 250 is almost aggregated at the top of the spacer layer 240, a lateral etch rate at the top of the spacer layer 240 is higher than a lateral etch rate near a bottom of the spacer layer 240.

With different lateral etch rates of different portions of the spacer layer 240, a portion of the spacer layer 240 is removed by the etching gas 250 to form a tapered spacer 242 adjacent to the liner layer 230, which the tapered spacer 242 includes a top thickness $T_T$ and a bottom thickness $T_B$, and the top thickness $T_T$ is less than the bottom thickens $T_B$. In addition, the tapered spacer 242 has a side surface 242S extending from the top thickness $T_T$ to the bottom thickness $T_B$, and an included angle θ between the substrate 210 and the side surface 242S of the tapered spacer 242 is in a range from about 40 degrees to about 75 degrees. Specifically, the top of the spacer layer 240 is lateral etched to reduce the thickness from T to $T_T$, but the bottom of the spacer layer 240 is barely lateral etched, so the tapered spacer 242 has the bottom thickness $T_B$ substantially the same with the thickness T of the spacer layer 240. Therefore, the length of the channel between source 210S and the drain 210D could be maintained at a desired value.

In some embodiments, the top thickness $T_T$ is in a range from about 0 nm to about 37 nm to ensure that the gate structure 220 is insulated from other devices. In some embodiments, the bottom thickness $T_B$ is in a range from about 38 nm to about 68 nm to avoid short channel effect and hot electron effect.

Figure 2E:
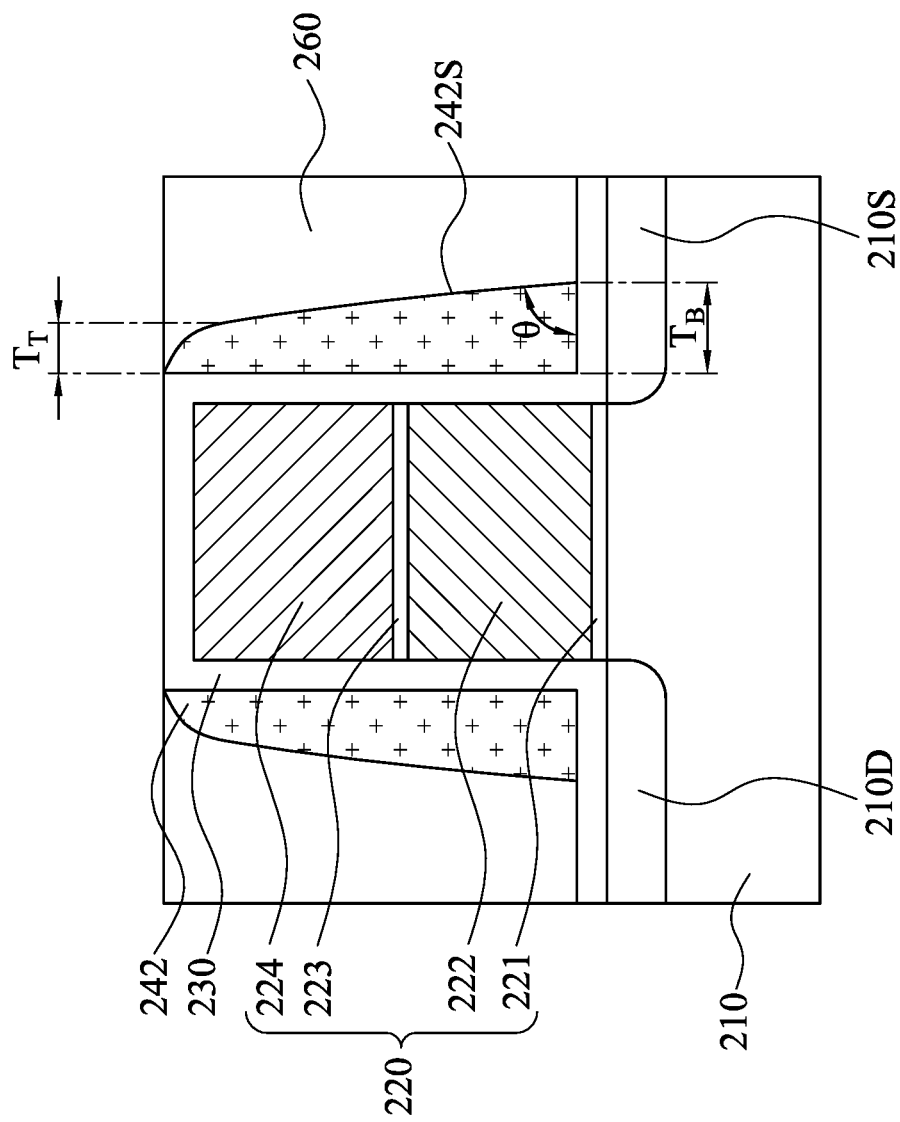

Continuing in FIG. 2E, an inter-layer dielectric layer 260 is form to cover the tapered spacer 242. The inter-layer dielectric layer 260 is formed by depositing a dielectric material to cover the tapered spacer 242, so as to isolate the gate structure 220 from adjacent semiconductor devices or metal lines to avoid short circuit. In some embodiments, the inter-layer dielectric layer 260 is formed of un-doped oxide (USG), fluorinated silicate glass (FSG), B, P silicate glass (BPSG) or low-k dielectric materials. In some embodiments, the inter-layer dielectric layer 260 is formed by using chemical vapor deposition (CVD), physical vapor deposition (PVD), atomic layer deposition (ALD) or other suitable depositing processes.

Figure 4A:
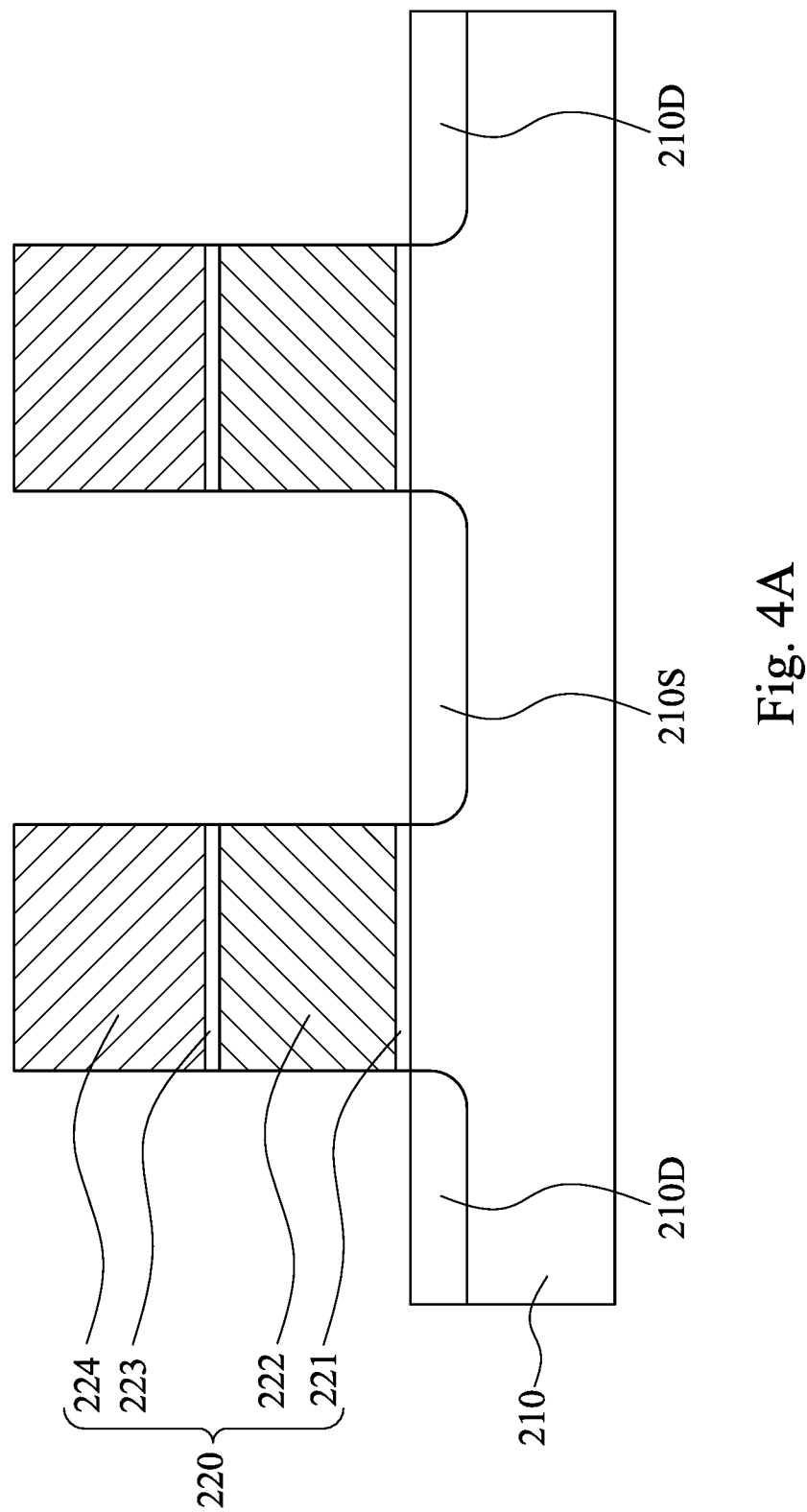
FIGS. 4A to 4D are cross-sectional views of the semiconductor structure at an intermediate stage of fabrication, in accordance with various embodiments.

FIGS. 4A to 4D are cross-sectional views of the semiconductor structure at an intermediate stage of fabrication, in accordance with various embodiments. With respect to the embodiments of FIGS. 2A to 2E, like elements in FIGS. 4A to 4D are designated with the same reference numbers for ease of understanding. In FIG. 4A, two gate structures 220 are formed on a substrate 210. The two gate structures 220 may be formed using suitable processes including photolithography and etching processes. First, a gate material is formed to cover the substrate, and a photoresist layer (not shown) is formed to overly the gate material. Then, the photoresist layer is exposed to form a pattern, and a post-exposure bake process and a developing process are performed to form a masking element. The masking element mentioned above is used to protect portions of the gate material while performing the etching process, leaving the two gate structures 220 on the substrate 210.

After forming the gate structure 220, an ion implantation process is performed to form doped regions in the substrate 210. The doped regions include a source 210S and a drain 210D respectively on opposite sides of the gate structure 220 and aligned with respect to sidewall of the gate structure 220, and the source 210S is a common source shared by the two gate structures 220. In some embodiments, the gate structures 220 are memory gate structures respectively including a gate insulation layer 221, a floating gate 222 on the gate insulation layer 221, an inter-gate dielectric layer 223 on the gate insulation layer 221 and a control gate 224 on the inter-gate dielectric layer 223.

Figure 4B:
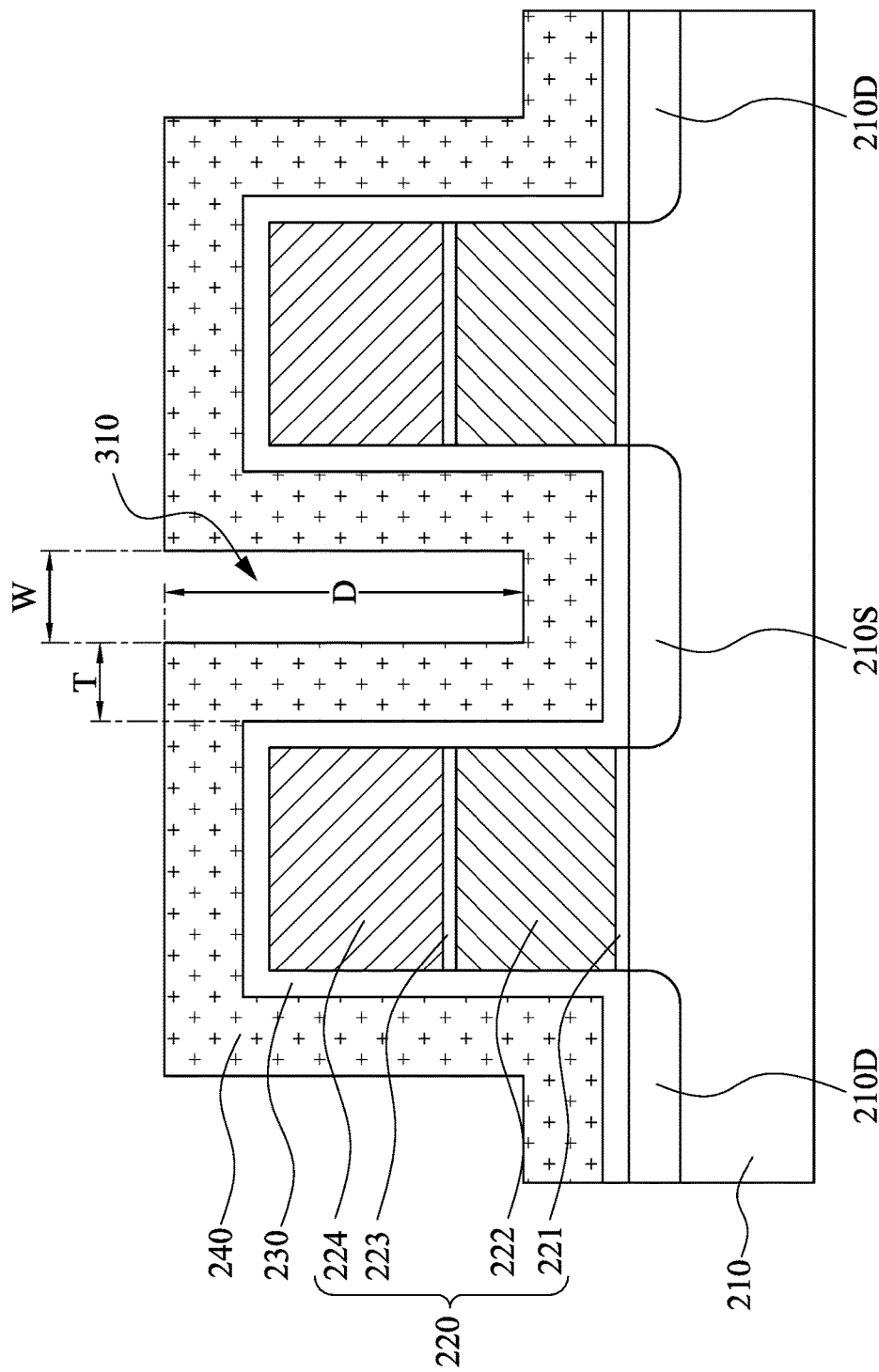

Continuing in FIG. 4B, a spacer layer 240 is formed to cover the two gate structures 220. The spacer layer 240 is formed by conformably depositing an appropriate material to cove the two gate structures 220, and the spacer layer 240 has a uniform thickness T. In some embodiments, a liner layer 230 is formed between the spacer layer 240 and the gate structures 220. The liner layer 230 may be formed by conformably depositing a layer of an appropriate material, so as to cove the substrate 210 and the two gate structures 220.

As shown in FIG. 4B, a gap 310 having a width W and a depth D is remained between the two adjacent gate structures 220, and the depth D is divided by the width W to obtain an aspect ratio R of the gap 310. It should be noticed that the width W of the gap is related to a gap-filling ability of the inter-layer dielectric layer formed in the subsequent process, and the gap having the small width W increases the difficulty of fully filling the gap 310 with the inter-layer dielectric layer. Even though the thickness T of the spacer layer could be reduced to enlarge the width W of the gap 310, but the spacer layer 240 having the smaller thickness T shortens a length of the channel between source 210S and the drain 210D and causes hot electron effect to affect a resistance of the semiconductor structure.

Figure 4C:
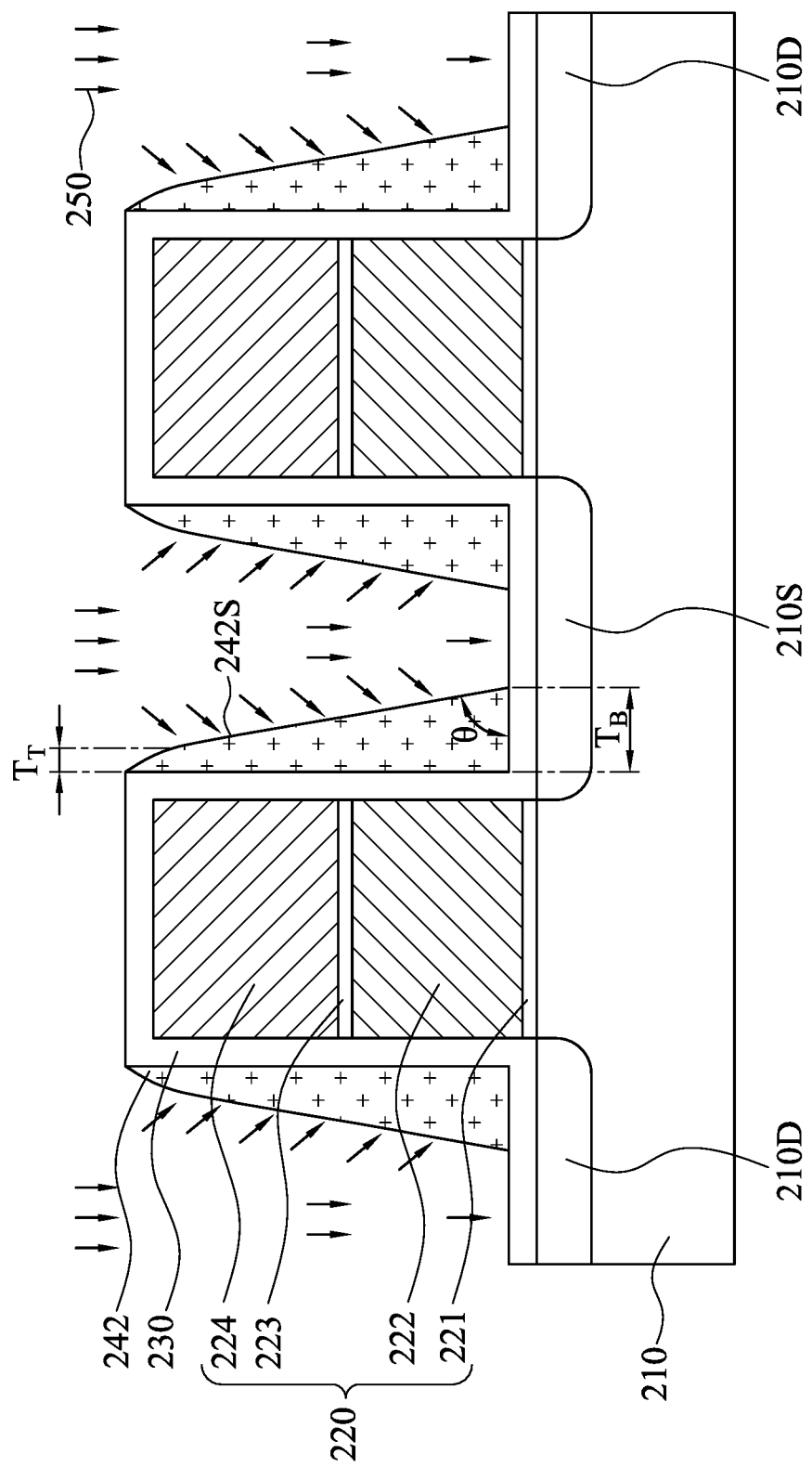

Continuing in FIG. 4C, a portion of the spacer layer 240 is removed based on the aspect ratio R of the gap 310 to form tapered spacers 242 respectively on sidewalls of the two gate structures 220, and an included angle θ between the substrate 210 and a side surface 242S of the tapered spacer 242 is decreased with respect to increase of the aspect ratio R of the gap 310. As aforementioned in FIG. 2D, the substrate 210 is placed in the vacuum chamber 310 of the dry etching apparatus 300, and the etching gas 250 having a first pressure P1 is continuously provided into the vacuum chamber 310 to remove the portion of the spacer layer 240. In addition, the substrate 210 in the vacuum chamber 310 is maintained at the second pressure P2 to lateral etch the spacer layer 240 and assure the portion of the spacer layer 240 is removed to form the tapered spacer 242.

To be noticed, the pressure difference between second pressure P2 of the substrate 210 and the first pressure P1 of the etching gas 250 is related to the profile of the tapered spacer 242. As aforementioned, the depth D is divided by the width W to obtain the aspect ratio R of the gap 310, and the aspect ratio R is increased with respect to the decrease of the width W when fixing the depth D of the gap 310. If the two gate structure 220 getting closed, the gap 310 will have the small width W and the large aspect ratio R, which is unfriendly for filling the inter-layer dielectric layer. On the purpose to enlarge the width of the gap 310, the pressure difference should be increased, which means that the force pulling downward the etching gas 250 is further decreased to remain more etching gas 250 aggregated at the top of the spacer layer 240. That is, the lateral etch rate at the top of the spacer layer 240 is further increased, so the tapered spacer 242 is form to have small top thickness $T_T$, which enlarges the width W of the gap 310 to enhance the gap-filling ability of the inter-layer dielectric layer formed in the subsequent process. However, the bottom thickness $T_B$ is still substantially the same with the thickness T of the spacer layer 240 to maintain the length of the channel between source 210S and the drain 210D at a desired value. As such, a thickness difference between the top thickness $T_T$ and the bottom thickness $T_B$ is increased, so the side surface 242S extending from the top thickness $T_T$ to the bottom thickness $T_B$ is tilted toward the gate structure 220, and thus decreases the included angle θ between the substrate 210 and the side surface 242S of the tapered spacer 242. Given the above, the included angle θ between the substrate 210 and the side surface 242S of the tapered spacer 242 is decreased with respect to the increase of the aspect ratio R of the gap 310.

In some embodiments, the aspect ratio R of the gap 310 is in a range from about 2 to about 6. In some embodiments, the included angle θ between the substrate 210 and the side surface 242S of the tapered spacer 242 is in a range from about 40 degrees to about 75 degrees.

Figure 4D:
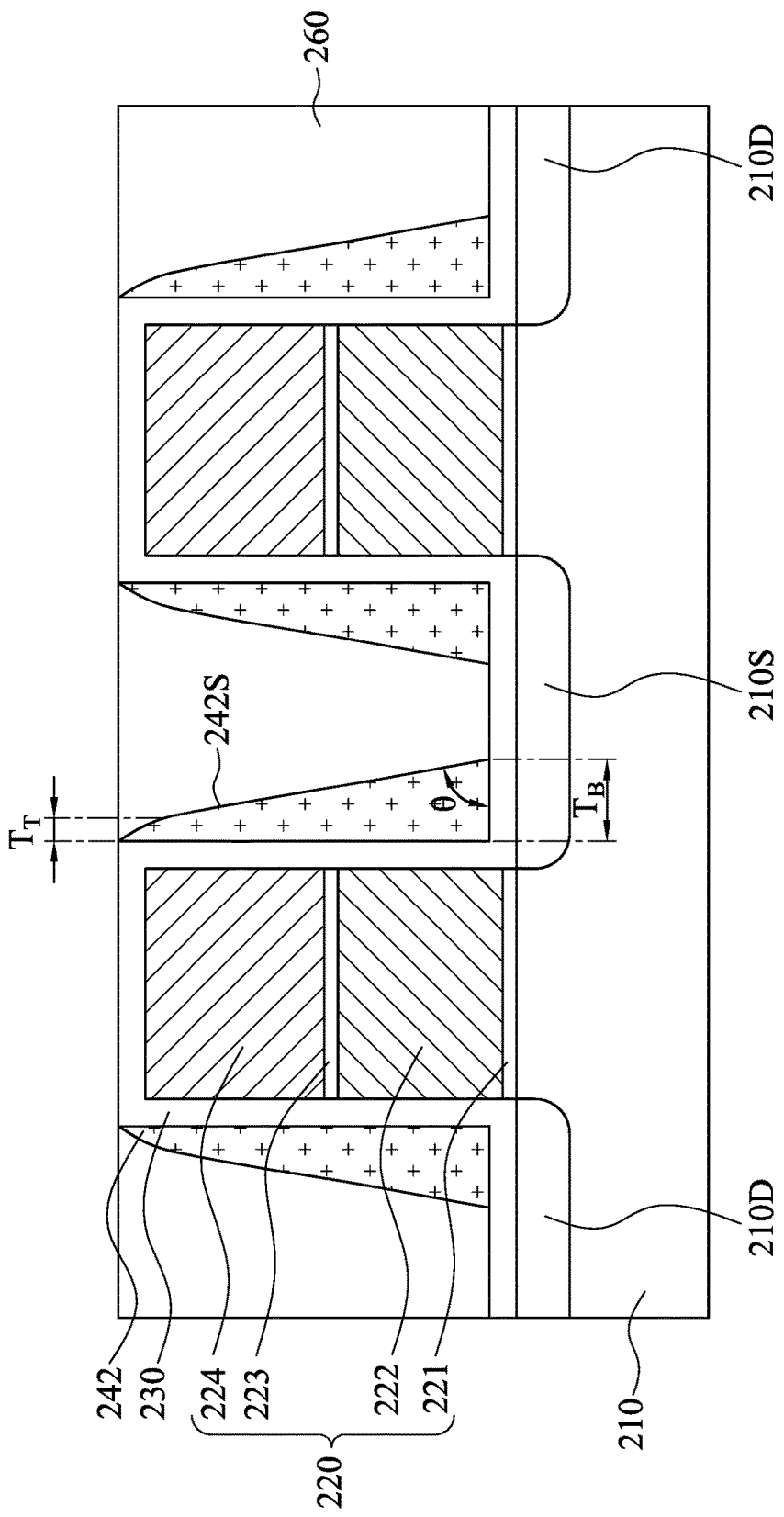

Continuing in FIG. 4D, an inter-layer dielectric layer 260 is formed to fully filled the gap 310. The inter-layer dielectric layer 260 is formed by depositing a dielectric material covering the tapered spacer 242 and the gate structures 220, and a portion of the dielectric material enters a space between the two adjacent tapered spacers 242 to fully fill the gap 310. Then, a chemical mechanical polishing (CMP) process is performed to remove excess dielectric material, so as to form the inter-layer dielectric layer 260 having a plane top surface. As mentioned in FIG. 4C, the tapered spacer 242 enlarges the width W of the gap 310 to decrease the difficulty of filling the dielectric material into the gap 310. As such, the gap-filling ability is improved to make the dielectric material easily enter the gap 310, and the void-free inter-layer dielectric layer 260 could be formed.

The embodiments of the present disclosure discussed above have advantages over existing methods and structures, and the advantages are summarized below. According to some embodiments, an improved method of fabricating a semiconductor structure is provided to improve the gap-filling ability of an inter-layer dielectric layer. With controlling a spacer to have a tapered profile, a width of a gap is increased to make the dielectric material easily fully fill the gap, and the inter-layer dielectric layer is formed without voids therein. Therefore, the concern of leakage is reduced to improve the yield of the semiconductor structure. On the other hand, a pressure of the vacuum chamber is maintained at a value greater than a pressure of an etching gas, which is aggregated to lateral etch a top of a spacer layer and form the tapered spacer. In addition, an included angle between the substrate and a side surface of the tapered spacer is adjusted with respect to an aspect ratio of the gap, so as to assure the gap having different aspect ratios could be fully filled.

In accordance with some embodiments, the present disclosure discloses a method of fabricating a semiconductor structure, and the method includes following steps. A gate structure is formed on a substrate, and a liner layer is formed to cover the gate structure and the substrate. A spacer layer is formed on the liner layer, and an etching gas is continuously provided to remove a portion of the spacer layer while maintaining the substrate at a second pressure, which the etching gas has a first pressure. The second pressure is greater than the first pressure.

In accordance with some embodiments, the present disclosure discloses a method of fabricating a semiconductor structure, and the method includes following steps. Two gate structures are formed on a substrate, and a spacer layer is formed to cove the two gate structures, which a gap is between the two gate structures. A portion of the spacer layer is removed based on an aspect ratio of the gap to form tapered spacers respectively on sidewalls of the two gate structures, and an included angle between the substrate and a side surface of the tapered spacer is decreased with respect to increase of the aspect ratio of the gap. Then, an inter-layer dielectric layer is formed to fully fill the gap.

In accordance with some embodiments, the present disclosure discloses a method of fabricating a semiconductor structure, and the method includes following steps. A substrate is placed in a vacuum chamber, which the substrate has a gate structure thereon and a spacer layer covering the gate structure. An etching gas is supplied into the vacuum chamber and being controlled at a first pressure. A exhausting unit is used to maintain the vacuum chamber at a second pressure greater than the first pressure, and a portion of the spacer layer is removed by the etching gas to form a tapered spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, the method comprising:
    placing a substrate in a vacuum chamber, and the substrate having a gate structure thereon and a spacer layer covering the gate structure;
    supplying an etching gas into the vacuum chamber at a first rate;
    controlling the etching gas at a first pressure;
    using an exhausting unit to exhaust etching gas and a byproduct of the etching gas at a second rate less than the first rate to increase a pressure of the vacuum chamber until the vacuum chamber is at a second pressure greater than the first pressure; and
    using the exhausting unit to maintain the vacuum chamber at the second pressure while continuing to supply the etching gas into the vacuum chamber, wherein a portion of the spacer layer is removed by the etching gas to form a tapered spacer.

2. The method of claim 1, wherein the first pressure is in a range from 100 mtorr to 150 mtorr.

3. The method of claim 1, wherein the second pressure is in a range from 200 mtorr to 300 mtorr.

4. The method of claim 1, wherein the exhausting unit is a turbo pump.

5. The method s of claim 1, wherein an included angle between the substrate and a side surface of the tapered spacer is in a range from about 40 degrees to about 75 degrees.

6. The method of claim 1, wherein a top width of the tapered spacer is less than a bottom width of the tapered spacer.

7. A method of fabricating a semiconductor structure, the method comprising:
- forming a gate structure on a substrate;
- forming a liner layer to cover the gate structure and the substrate;
- forming a spacer layer on the liner layer;
- supplying an etching gas into a vacuum chamber at a first rate and at a first pressure;
- exhausting etching gas and a byproduct of the etching gas at a second rate less than the first rate to increase a pressure of the vacuum chamber until the vacuum chamber is at a second pressure greater than the first pressure; and
- etching a portion of the spacer layer to form a tapered spacer while the substrate is in the vacuum chamber and the etching gas is supplied at the first pressure and the vacuum chamber is at the second pressure.

8. The method of claim 7, wherein the first pressure is in a range from 100 mtorr to 150 mtorr.

9. The method of claim 8, wherein the second pressure is in a range from 200 mtorr to 300 mtorr.

10. The method of claim 7, wherein the etching gas having the first pressure is continuously provided into the vacuum chamber while the vacuum chamber is maintained at the second pressure.

11. The method of claim 7, wherein the liner layer remains intact after the etching is complete.

* * * * *